(12) United States Patent
Chao

(10) Patent No.: US 8,045,367 B2
(45) Date of Patent: Oct. 25, 2011

(54) PHASE CHANGE MEMORY

(75) Inventor: Te-Sheng Chao, Dadu (TW)

(73) Assignee: Nanya Technology Corp., Taoyuan (TW)

( * ) Notice: Subject to any disclaimer, the term of this patent is extended or adjusted under 35 U.S.C. 154(b) by 701 days.

(21) Appl. No.: 12/188,293

(22) Filed: Aug. 8, 2008

(65) Prior Publication Data

US 2009/0040820 A1 Feb. 12, 2009

(30) Foreign Application Priority Data

Aug. 9, 2007 (TW) ............................... 96129356 A

(51) Int. Cl.
*G11C 11/00* (2006.01)
(52) U.S. Cl. ...................... 365/163; 365/148; 977/754
(58) Field of Classification Search .................. 365/46, 365/94, 100, 113, 129, 148, 163; 257/2–5, 257/9, 296, 310, E21.35, E31.047, E27.006; 438/29, 95, 96, 166, 135, 240, 785, 259, 438/365, 482, 486, 597; 977/754
See application file for complete search history.

(56) References Cited

U.S. PATENT DOCUMENTS

| | | | |
|---|---|---|---|
| 6,314,014 B1 | 11/2001 | Lowery et al. | |
| 7,248,494 B2 * | 7/2007 | Oh et al. | 365/148 |
| 7,465,951 B2 * | 12/2008 | Scheuerlein | 257/3 |
| 7,750,334 B2 * | 7/2010 | Toda | 257/2 |
| 2006/0050548 A1 * | 3/2006 | Oh et al. | 365/148 |
| 2006/0157682 A1 * | 7/2006 | Scheuerlein | 257/4 |
| 2009/0161417 A1 * | 6/2009 | Fackenthal et al. | 365/163 |

* cited by examiner

*Primary Examiner* — Richard Elms
*Assistant Examiner* — Harry W Byrne
(74) *Attorney, Agent, or Firm* — Wang Law Firm, Inc.; Li K. Wang

(57) ABSTRACT

A phase change memory with a primary memory array, a reference memory array, and a comparison circuit is provided. The electrical characteristic curve of the recording layers of the primary memory units is different from the electrical characteristic curve of the recording layers of the reference memory units. The primary memory array includes at least one primary memory unit to generate at least one sensing signal, wherein each of the primary memory units includes at least one recording layer can be programmed to a first resistance and a second resistance. The reference memory array includes at least one reference memory unit to generate at least one reference signal, wherein each of the reference memory units includes at least one recording layer can be programmed to change its resistance. The comparison circuit compares the sensing signal and the reference signal to generate a comparison result.

10 Claims, 7 Drawing Sheets

PHASE CHANGE MEMORY

BACKGROUND OF THE INVENTION

1. Field of the Invention

The invention relates to the phase change memory, and more particularly to the reference memory unit of the phase change memory.

2. Description of the Related Art

With the growth in the use of portable electronic devices, demand for non-volatile memory has increased. Among all kinds of emerging non-volatile memories, phase change memory is the most promising candidate for the next generation non-volatile memory due to its higher speed, lower power consumption, higher capacity, reliability, easier process integration and lower cost.

Phase change memory is based on the fast and reversible phase transitions of chalcogenide alloy which result in a highly resistive amorphous state and low resistive crystalline state, i.e. the logic data of 1 and 0. Thus, an adequate read circuit is desirable for correctly and reliably sensing the programmed data of the phase change memory. Typically a memory system comprises a reference memory array and a primary memory array. The unit cells in the reference memory array generate reference signals which are different from the signals generated by the programmed bits in the primary memory array. The read circuit is thus used to compare the reference signals with the signals from the primary memory array such that the programmed data in the primary memory array can be identified. To avoid a wrong sensing of the programmed state due to the reference signal error, it is important to develop an ideal reference memory array.

The ideal reference memory array must have the characteristics: (1) easy implementation without additional processes or complicated circuit design; (2) high reliability and stability, i.e. the reference memory array has a high tolerance to the memory state variation of the phase change memory; (3) flexibility and compatibility with memory array.

FIG. 1 is a schematic diagram of a conventional memory array with a parallel-connected reference memory array announced by Ovonyx Inc. in 2001. The phase change memory 100 comprises a primary memory array, columns C1 to C4, a reference memory array 130, columns C5 and C6, and a comparison circuit 140. The primary memory array 120 comprises a plurality of the memory units 121 and the reference memory array 130 comprises a plurality of reference memory units 131, wherein the memory units 121 and the reference memory unit 131 have the same structure. When the phase change memory 100 is accessed, the primary memory array 120 provides sensing signals SSE1 to SSE4 corresponding to the memory states and the reference memory array 130 provides a reference signal SRE. The comparison circuit 140 then compares the signals SSE1 to SSE4 with the signal SRE to identify the data stored in the phase change memory 100. In the conventional memory architecture, the reference memory array 130 is implemented by two columns, C5 and C6, parallel connected to the primary memory array 120. The memory units 121 of the primary memory array 120 and the reference memory unit 131 of the reference memory array 130 have the same structure. According to this architecture, however, the reference signal SRE generated by the conventional reference memory array 130 is nest easily adjustable and the reference signal SRE may drift due to process variation. In other words, the reference signal SRE may mix with the sensing signal SSE corresponding to a specific memory state, thus easily leading to a sensing deviation.

Assuming that the memory unite in the primary memory array 120 have two memory states, i.e., high resistance reset state and low resistance set state, the voltage difference between the sensing signal SSE and the reference signal SRE can be respectively given as follows:

$$\Delta V_{reset} = V_{sense} - V_{reference} = I_{read1} \times R_{reset} - I_{read2} \times (R_{reset} \| R_{set}) \quad (1),$$

$$\Delta V_{set} = V_{sense} - V_{reference} = I_{read1} \times R_{set} - I_{read2} \times (R_{reset} \| R_{set}) \quad (2),$$

wherein $I_{read1}$ is the read current applied to the primary memory array, $I_{read2}$ is the read current applied to the reference memory array, $R_{set}$ is the resistance when the memory unit is in the set stste, and $R_{reset}$ is the resistance when the memory unit is in the reset state. In order to make sure that the reference signal is approximate to the average of two sensing signals of reset state and set atate, the magnitude of the read current $I_{read2}$ is usually twice the magnitude of the read current $I_{read1}$. Thus, the equations (1) and (2) can be written as follows:

$$|\Delta V_{reset}| = |V_{sense} - V_{reference}| = I_{read1} \times [R_{reset} - 2(R_{reset} \| R_{set})] \quad (3),$$

$$|\Delta V_{set}| = |V_{sense} - V_{reference}| = I_{read1} \times [2(R_{reset} \| R_{set}) - R_{set}] \quad (4).$$

Since the resistance $R_{reset}$ is much larger than the resistance $R_{set}$, the $|\Delta V_{reset}|$ is large enough to be determined. However, the $|\Delta V_{set}|$ is relatively small such that the reference signal is more unreliable and a sensing error may occur.

BRIEF SUMMARY OF THE INVENTION

One embodiment of the invention provides a phase change memory having a primary memory block and a reference memory block, wherein the structure of the memory unit in the primary block is different from the structure of the memory unit in the reference block. The states of the memory unit in the reference memory block are different from the states of the memory unit in the primary memory block. The sensing signal generated by the reference memory block can be adjusted by adequately changing the structure of the memory unit in the reference memory block such that the sensing capability of the comparison circuit can be improved.

Another embodiment of the invention provides a phase change memory comprising a primary memory array, a reference memory array, and a comparison circuit. The primary memory array comprises at least one primary memory unit to generate at least one sensing signal, wherein each of the primary memory units comprises at least one recording layer which can be programmed to a first resistance and a second resistance. The reference memory array comprises at least one reference memory unit to generate at least one reference signal, wherein each of the reference memory units comprises at least one recording layer which can be programmed to change its resistance. The comparison circuit which is coupled to the primary memory array and the reference memory array is used to compare the sensing signal and the reference signal and generate a comparison result.

The electrical characteristics of the recording layers of the primary memory cells are different from the electrical characteristics of the recording layers of the reference memory cells. In another embodiment, the dimension of at least one recording layer of the primary memory unit is different from the dimension of at least one recording layer of the reference memory unit. In another embodiment, each primary memory unit further comprises a first heating electrode coupled to the recording layer of the primary memory unit, each reference memory unit further comprises a second heating electrode coupled to the recording layer of the reference memory unit, and the contact area of the first heating electrode and the recording layer of the primary memory unit is different from the contact area of the second heating electrode and the recording layer of the reference memory unit.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the contemplated mode of carrying out the invention. This description is made for the purpose of illustrating the general principles of the invention and should not be taken in a limiting sense. The scope of the invention is best determined by reference to the appended claims.

Figure 1:
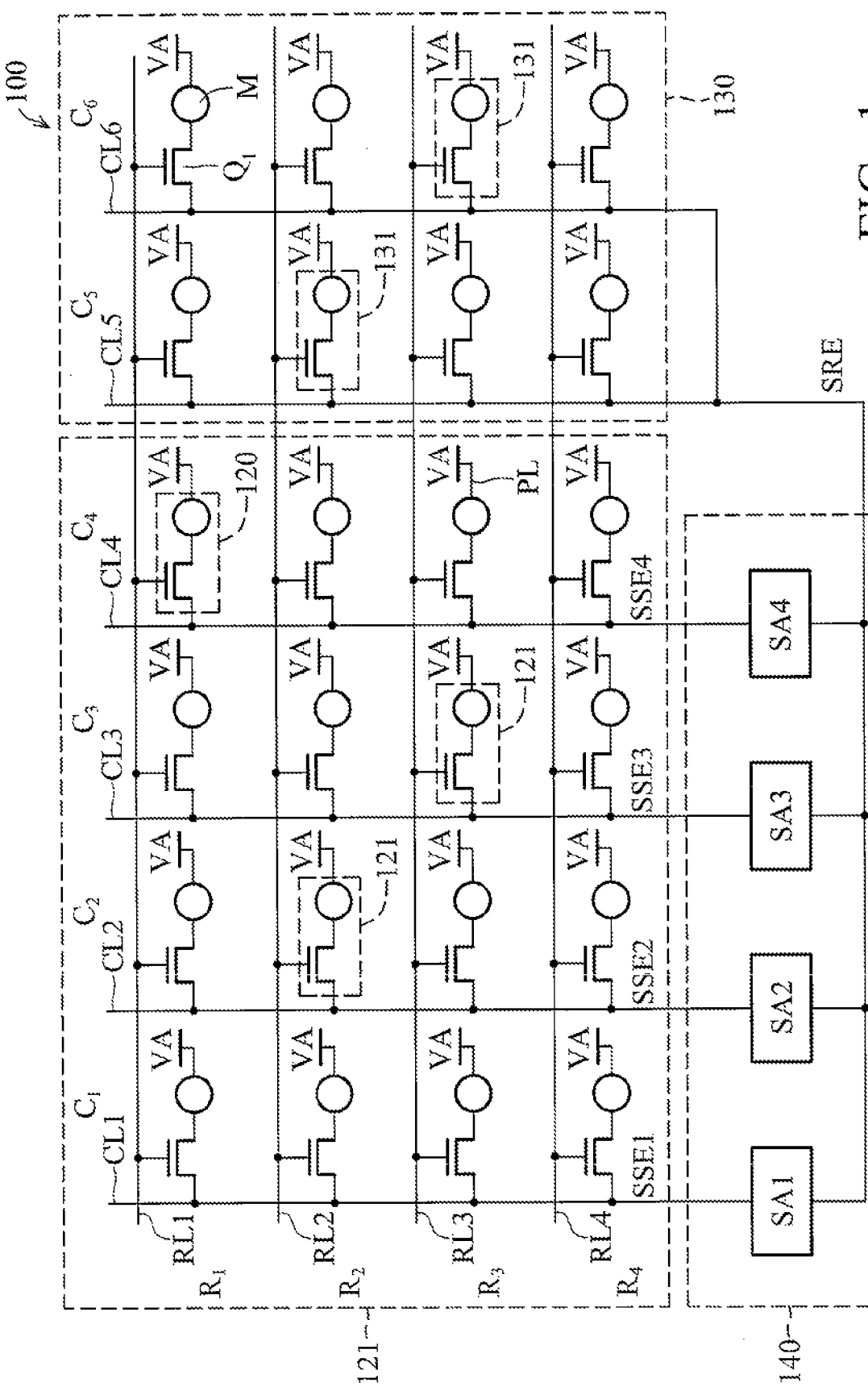
FIG. 1 is a schematic diagram of a conventional memory array with a parallel-connected reference memory array announced by Ovonyx Inc. in 2001.
Figure 2:
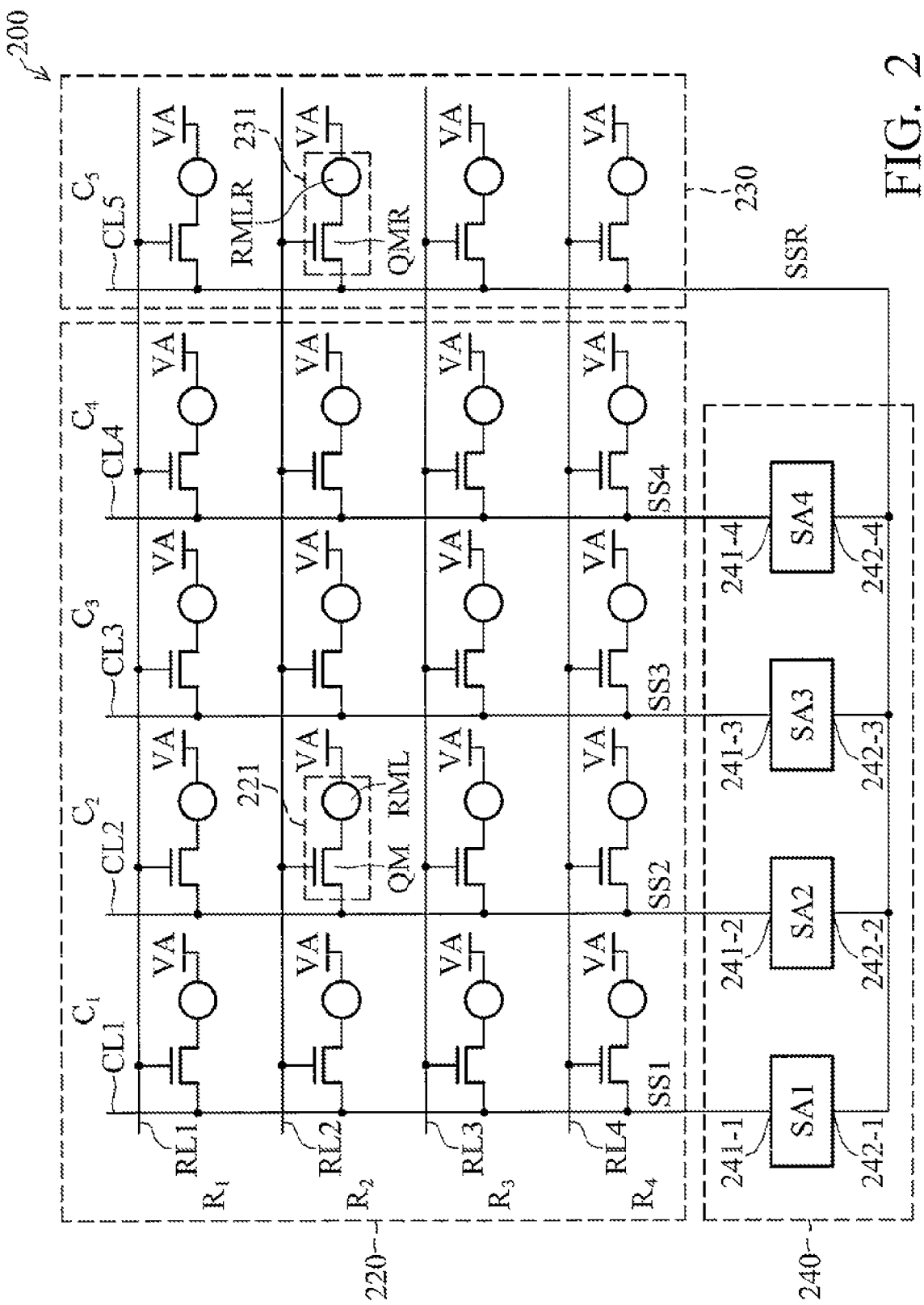
FIG. 2 is a block diagram of an embodiment of the phase change memory 200 of the invention.

FIG. 2 is a block diagram of an embodiment of the phase change memory 200 of the invention. The phase change memory 200 comprises a primary memory block 220, a reference memory block 230 and a comparison circuit 240.

The primary memory block 220 comprises a plurality of primary memory units 221 arranged in at least one column and at least one row to form a memory array, such as the columns C1 to C4 and rows R1 to R4. The primary memory block 220 further comprises at least one column line and at least one row line, such as the column limes CL1 to CL 4 and row lines RL1 to RL4, respectively coupled to the corresponding primary memory units 221. Each of the primary memory units 221 comprises a transistor QM and a recording layer RML coupled to the transistor QM and a reference voltage VA. It is noted that the locations of the transistor QM and the recording layer RML can be interchangeable.

When writing one primary memory unit 221, the corresponding transistor QM is turned on and the writing current is applied to the recording layer RML of the primary memory unit 221 to change the resistance of the recording layer RML of the primary memory unit 221. The recording layer RML of the primary memory unit 221 has an electrical characteristic curve which shows the relationship between the programming current passing through the recording layer RML of the primary memory unit 221 and the resultant resistance of the recording layer RML of the primary memory unit 221, or the relationship between the programming voltage and the resultant resistance of the recording layer RML of the primary memory unit 221. The recording layer RML of the primary memory unit 221 can be programmed to a first resistance (set resistance) and a second resistance (reset resistance), which comprise 1-bit of data stored in the primary memory unit 221.

The primary memory block 220 generates at least one sensing signal. As shown in FIG. 2, the columns C1 to C4 of the primary memory block 220 provides sensing signal SS1 to SS4 coupled to the comparison circuit 240 via the column lines CL1 to CL4. When reading one primary memory unit 221, the corresponding transistor QM is turned on and a first read current IRE1 (not shown in FIG. 2) is applied to the recording layer of a corresponding primary memory unit. It is rioted that the magnitude of the first read current IRE1 should be low enough to avoid changing the resistance of the recording layer of primary memory unit. In one embodiment, tire sensing signal is the sensing voltage generated when the first read current IRE1 passes through the recording layer of the primary memory unit. Thus, when the recording layer RML of the primary memory unit 221 is programmed to the first resistance R1 or the second resistance R2, the sensing voltage is R1×IRE1 or R2×IRE2 respectively.

The reference memory block 230 comprises a plurality of reference memory units 231 arranged in at least one column and at least one row to form a memory array, such as the column C5 and rows R1 to R4. The reference memory block 230 further comprises at least one column line and at least one row line, such as the column lime CL5 and row lines RL1 to RL4, respectively coupled to the corresponding reference memory units 231. Each of the reference memory units 231 comprises a transistor QMR and a recording layer RMLR coupled to the transistor QMR and a reference voltage VA. It is noted that the locations of the transistor QMR and the recording layer RMLR can be interchangeable. When writing one reference memory unit 231, the corresponding transistor QM is tinned on and the writing current is applied to the recording layer RMLR of the reference memory unit 231 to change the resistance of the recording layer RMLR of the reference memory unit 231. The recording layer RMLR of the reference memory unit 231 has an electrical characteristic curve which shows the relationship between the programming current passing through the recording layer RMLR of the reference memory unit 231 and the resultant resistance of the recording layer RMLR of the reference memory unit 231, or the relationship between the programming voltage and the resultant resistance of the recording layer RMLR of the reference memory unit 231. The recording layer RMLR of the reference memory unit 231 can be programmed to a reference resistance RR. Generally a write operation is performed in the reference memory block 230 and the recording layers of all the reference memory units 231 in the reference memory block 230 are programmed to the reference resistance RR before the phase change memory 200 starts to function.

The structure of at least one reference memory unit 231 is different from the structure of at least one primary memory unit 221. Thus at least one electrical characteristic curve of the recording layer of the primary memory unit 221 is different from the electrical characteristic curve of the recording layer of the reference memory unit 231. As a result, the reference resistance RR is different from the first resistance R1 and the second resistance R2. In the embodiment, the recording layers of the primary memory units 221 in the primary memory block 220 have the same electrical characteristic curve, the recording layers of the reference memory units 231 in the reference memory block 230 have the same electrical characteristic curve, and the electrical characteristic curve of the recording layer of the primary memory unit 221 is different from the electrical characteristic curve of the recording layer of the reference memory unit 231. The detailed structures of the primary memory unit 221 and the reference memory unit 231 are described in the following paragraphs.

The reference memory block 230 generates and provides at least one reference signal to the comparison circuit 240. As shown in FIG. 2, the reference memory unit 231 in the column C5 of the reference memory block 230 provides a reference signal SSR to the comparison circuit 240 via the column line CL5. When one primary memory unit 231 coupled to a selected row is activated, the corresponding reference memory unit 231 in the same row is also activated. When the transistor QM is turned on, the corresponding transistor QMR is also turned on and a second read current IRE2 (not shown in FIG. 2) is applied to the recording layer of a corresponding reference memory unit. In one embodiment, the magnitude of the first read current IRE1 is the same as the magnitude of the second read current IRE2. It is noted that the magnitude of the second read current IRE2 should be low enough to avoid changing the resistance of the recording layer of reference memory unit. In one embodiment, the reference signal is the sensing voltage generated when the second read current IRE2 passes through the recording layer of the reference memory unit. Thus, when the recording layer RMLR of the reference memory unit 231 is programmed to the resistance RR, the sensing voltage is RR×IRE2.

The comparison circuit 240 compares the sensing signals from the primary memory block 220 with the reference signal SSR from the reference memory block 230 to identify the memory state of the primary memory unit 221. When the phase change memory 200 is read, the comparison circuit 240 compares the sensing signals SS1 to SS4 with the reference signal SSR and outputs the corresponding output signals O1 to O4 according to the comparison results. The comparison circuit 240 can be implemented by at least one comparator, such as sensing amplifier. In this embodiment, the comparison circuit 240 comprises four sensing amplifiers SA1 to SA4, wherein each sensing amplifier has a first input terminal, such as input terminals 241-1 to 241-4, coupled to the corresponding column line and a second input terminal, such as input terminals 242-1 to 242-4, coupled to the corresponding reference memory unit 231 via the column line CL5. The sensing signal is related to the memory state of the corresponding primary memory unit 221 and the reference signal is related to the memory state of the corresponding reference memory unit 231. The comparison circuit 240 compares the sensing signal with the reference signal to identify the memory state of the corresponding primary memory unit 221 when performing the read operation of phase change memory 200.

At least one electrical characeristic curve of the recording layers of the primary memory cells is different from at least one electrical characeristic curve of the recording layers of the reference memory units, such that the reference resistance is different from the first resistance and the second resistance. Thus, even if the first read current IRE1 is the same as the second read current IRE2, the sensing voltage R1×IRE1 or R2×IRE2 is different from the reference voltage RR×IRE2 when the recording layer is programmed to the first resistance R1 or the second resistance R2. As a result, the comparison circuit 240 can identify the memory state of the primary memory unit according to the voltage difference between the sensing voltage and the reference voltage.

In this embodiment, the voltage difference between the sensing voltage and the reference voltage is larger than a predetermined voltage, thus increasing the accuracy of the comparison result generated by the comparison circuit 240.

Assuming the first read current IRE1 is approximately equal to the second read current IRE2 and the recording layer RML of the primary memory unit 221 can be programmed to a first resistance R1 and a second resistance R2 (R2>R1), the ideal reference resistance RR should be the average of the first resistance R1 and the second resistance R2. Thus, the reference voltage is approximately the average of a first voltage and a second voltage if the recording layer RML of the primary memory unit 221 can be programmed to a first resistance R1 and a second resistance R2. Tire first voltage is the sensing voltage when the recording layer RML of the primary memory unit 221 is programmed to a first resistance R1, and the second voltage is the sensing voltage when the recording layer RML of the primary memory unit 221 is programmed to a second resistance R2. Depending on whether the sensing voltage is smaller or larger than the reference voltage, the comparison circuit 240 can therefore determine whether the recording layer RML of the primary memory unit 221 is programmed to the first resistance R1 or the second resistance R2. The voltage difference between the sensing voltage and the reference voltage is (R2−R1)×IRE/2 when the recording layer RML of the primary memory unit 221 is programmed to the first resistance R1 or the second resistance R2. As for the conventional memory design, the voltage difference between the sensing voltage and the reference voltage is approximately equal to 0 when the recording layer RML of the primary memory unit 221 is programmed to the first resistance R1. In this embodiment, (R2−R1)×IRE/2 is larger than 0 since R2 is larger than R1. Therefore, the accuracy of the comparison result achieved by the comparison circuit 240 is better than the conventional design.

Figure 3:
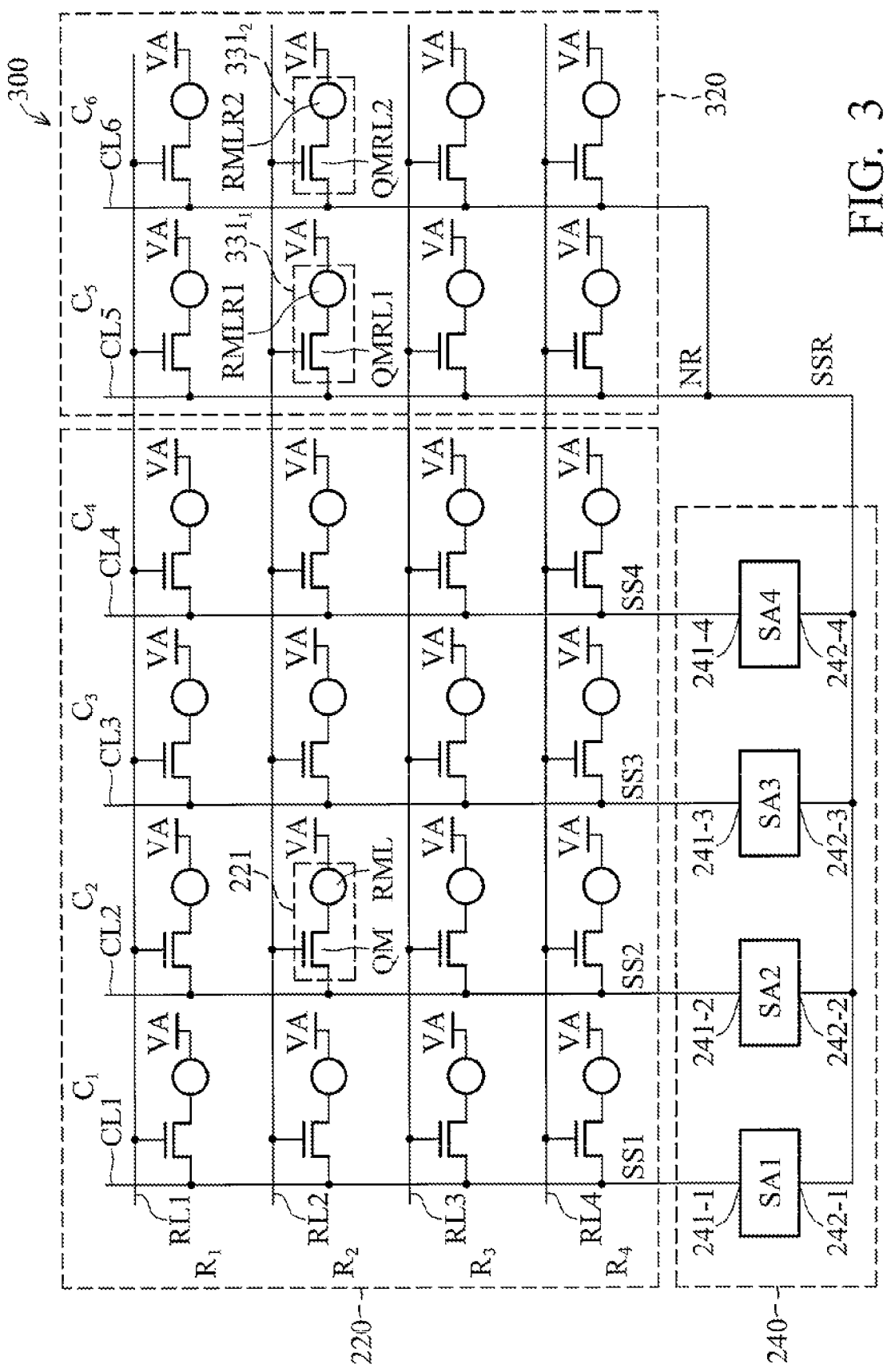
FIG. 3 is a block diagram of an embodiment of the phase change memory 300 of the invention.

It is noted that the reference memory block 230 is not limited to one column of reference memory units. In another embodiment, the reference memory block 230 comprises at least two columns of reference memory units. FIG. 3 is a block diagram of an embodiment of the phase change memory 300 of the invention. The difference between the phase change memories 300 and 200 is that the reference memory block in the phase change memory 300 comprises two columns of reference memory units. The operation of the other elements is the same as the operation of corresponding elements in FIG. 2, and is not described here for brevity. The reference memory unit 331 comprises a first reference memory unit $331_1$ and a second reference memory unit $331_2$, respectively arranged in two columns, C5 and C6. The first reference memory units $331_1$ are coupled to a column line CL5, the second reference memory units $331_2$ are coupled to a column line CL6, and the column lines CL5 and CL6 are coupled to a reference node NR and coupled to the comparison circuit 240 via a reference line CLR. The recording layer RMLR1 of each of the first reference memory units $331_1$ can be programmed to at least a first reference resistance RR1, and the recording layer RMLR2 of each of the second reference memory units $331_2$ can be programmed to at least a second reference resistance RR2. In this embodiment, the first resistance RR1 is the reset resistance of the recording layer RMLR1, and the second resistance RR2 is the set resistance of the recording layer RMLR2. In another embodiment, the first resistance RR1 is the set resistance of the recording layer RMLR1, and the second resistance RR2 is the reset resistance of the recording layer RMLR2.

In this embodiment, the structure of the first reference memory units $331_1$ and the second reference memory units $331_2$ can be the same or different. Furthermore, at least one structure of the first reference memory units $331_1$ and the second reference memory units $331_2$ is different from the structure of the primary memory units 221, such that at least one electric characteristic curve of the the first reference memory units $331_1$ and the second reference memory units $331_2$ can be different from that of the primary memory units 221. In this embodiment, the reference signal SSR is the reference voltage when the second read current IRE2 passes through the first reference memory unit $331_1$ and the second reference memory unit $331_2$. When the recording layer RMLR1 of the first reference memory unit $331_1$ is programmed to the first reference resistance RR1 and the recording layer RMLR2 of the second reference memory unit $331_2$ is programmed to the second reference resistance RR2, the reference voltage is equal to (RR1∥RR2)×IRE2. Since at least one electrical characteristic curve of the recording layers of the first reference memory units $331_1$ and the second reference memory units $331_2$ is different from that of the recording layers of the primary memory units 221, the reference voltage (RR1∥RR2)×IRE2 would be adjusted to be approximately equal to (R1+R2)×IRE2/2, thus increasing the accuracy of the comparison result achieved by the comparison circuit 240.

It is noted that each row of the phase change memory is coupled to a single one row of the reference memory units in the embodiments of FIG. 2 and FIG. 3. In another embodiment, each row of the phase change memory can be coupled to more than one row of the reference memory units.

It is also noted that the phase change memory shown in FIG. 2 and FIG. 3 can be coupled to a reference memory unit set comprising n reference memory units, wherein n is larger than 1. The structure of at least one reference memory unit is different from the structure of the primary memory unit 221. The values of n are respectively equal to 1 and 2 in FIG. 2 and FIG. 3. The connection type of the reference memory units is not limit to a parallel connection and can be any type of connection. The reference voltage is thus the product of a read current and the equivalent resistance of a reference memory unit set.

It is also noted that the column lines CL1 to CL4 are respectively coupled to sensing amplifiers SA1 to SA4 in FIG. 2 and FIG. 3. In another embodiment, the column lines CL1 to CL4 of the primary memory units can be coupled to the same sensing amplifier. For example, if the comparison circuit 240 comprises only one sensing amplifier and the column lines CL1 to CL4 of the primary memory units are all coupled to the sensing amplifier, the comparison circuit 240 will only read one primary memory unit at one time cycle.

The reference memory blocks 230 and 330 in FIGS. 2 and 3 only generate one reference signal. In another embodiment, the reference memory blocks 230 and 330 can generate more than one reference signal. The reference signal can be transformed into another reference signal via a transformation circuit, wherein the transformation circuit performs a linear transformation, a nonlinear transformation, addition, multiplication, division, or combinations thereof. The comparison circuit 240 receives the reference signal or the transformed reference signal.

The primary memory unit 221 or the reference memory units 231, $331_1$ or $331_2$ have only one recording layer in the embodiment shown in FIG. 2 and FIG. 3. In another embodiment, the primary memory unit 221 or the reference memory units 231, $331_1$ or $331_2$ have a plurality of recording layer's coupled in parallel or in series to each other, and the recording layer's can be programmed to an equivalent reference resistance.

In the following, an embodiment illustrating the structures of the reference memory unit 231 and the primary memory unit 221 structure is provided.

Figure 4A:
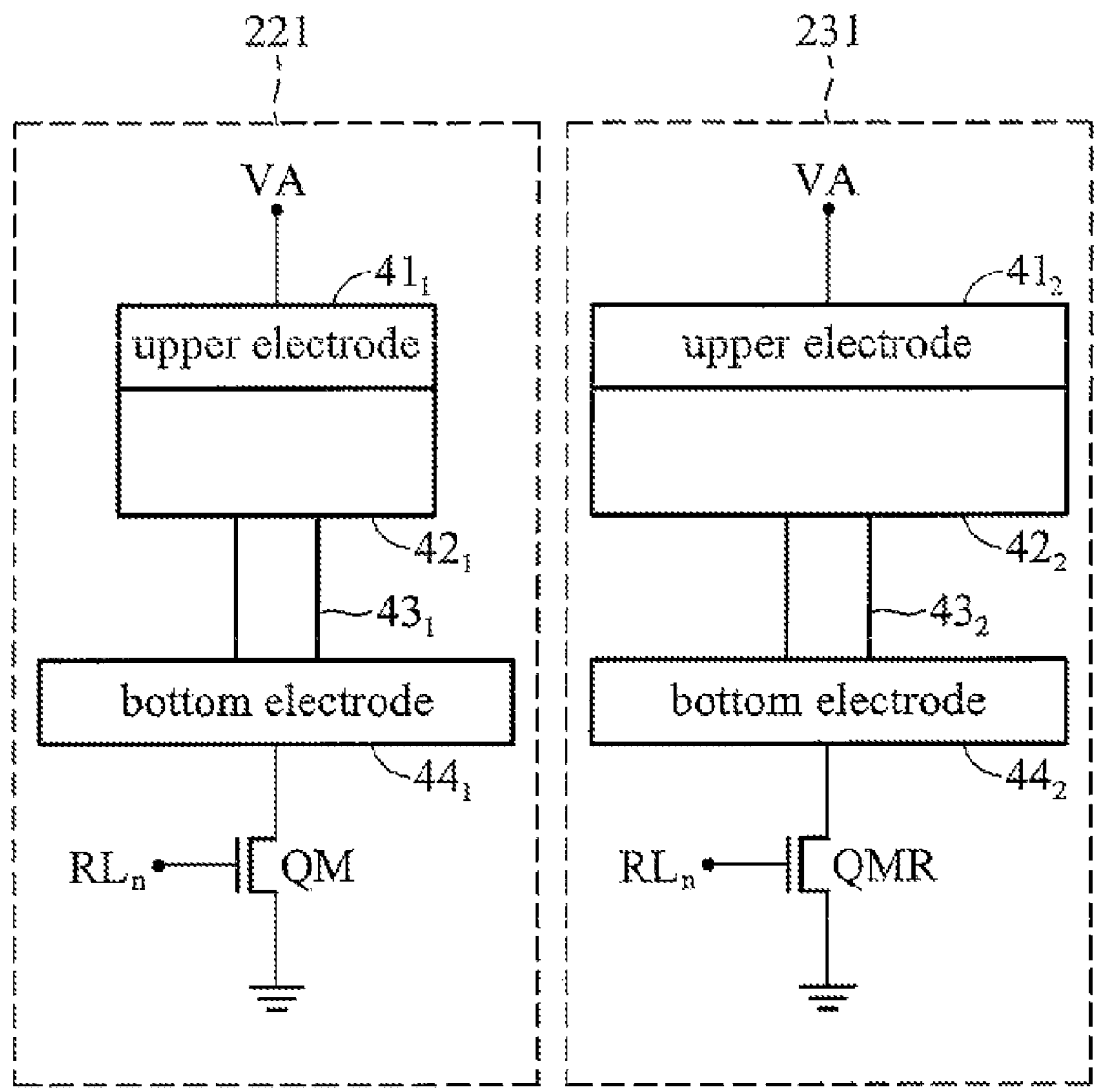
FIG. 4A is a schematic cross sections of an embodiment of the reference memory unit 231 and the primary memory unit 221.
Figure 4B:
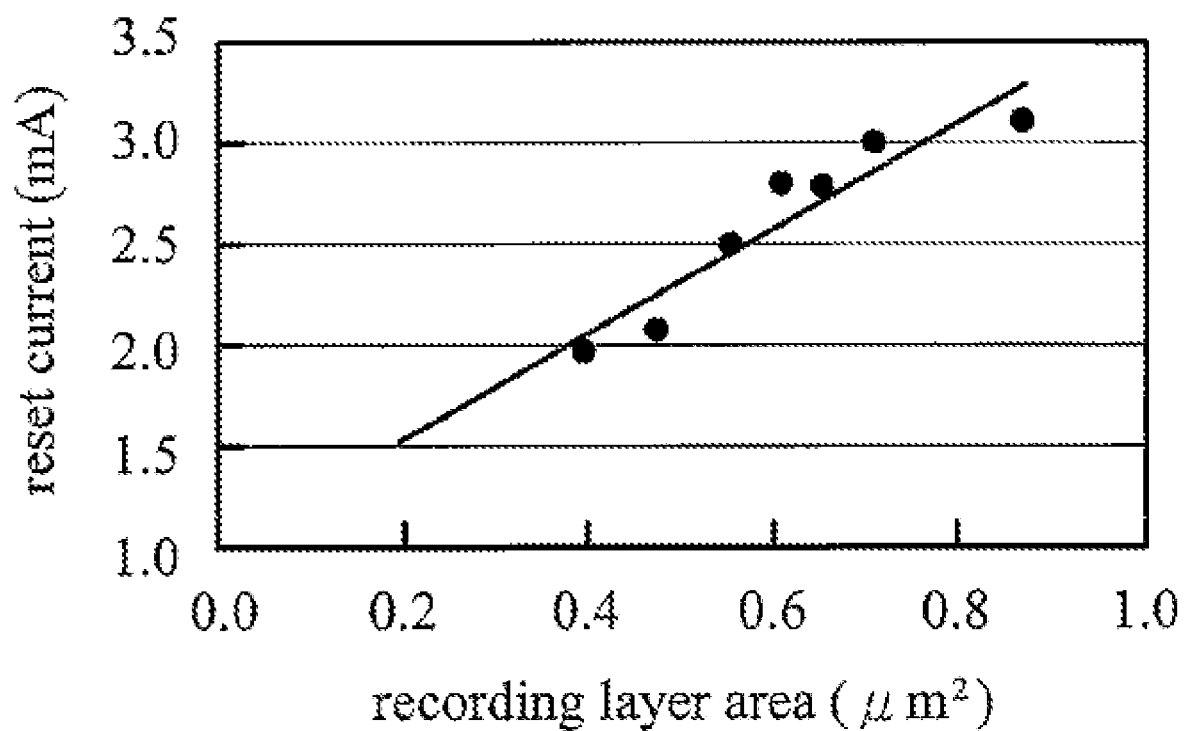
FIG. 4B is the relationship between the cross section area and the reset current reported by Samsung Inc. in IEDM 2003.

FIG. 4A is a schematic cross sections of an embodiment of the reference memory unit 231 and the primary memory unit 221. The primary memory unit 221 comprises an upper electrode $41_1$, a recording layer $42_1$, a heating electrode $43_1$, and a bottom electrode $44_1$. The reference memory unit 231 comprises an upper electrode $41_2$, a recording layer $42_2$, a heating electrode $43_2$, and a bottom electrode $44_2$. As shown in FIG. 4A, the cross section areas of the recording layers $42_1$ and $42_2$ are different and the material used for the recording layers $42_1$ and $42_2$ may also be different. FIG. 4B is the relationship between the cross section area and the reset current reported by Samsung Inc. in IEDM 2003. The reset current means the current required for changing the recording layer from a crystalline state to an amorphous state. According to FIG. 4B, the reset current is a function of the cross section area of the recording layer. Therefore, even when the same current is applied to the recording layers $42_1$ and $42_2$, the recording layers $42_1$ and $42_2$ may be programmed to different resistances. That is, the electrical characeristic curve of the recording layer of the primary memory unit 221 is thus different from the electrical characeristic curve of the recording layer of the reference memory unit 231.

Figure 5A:
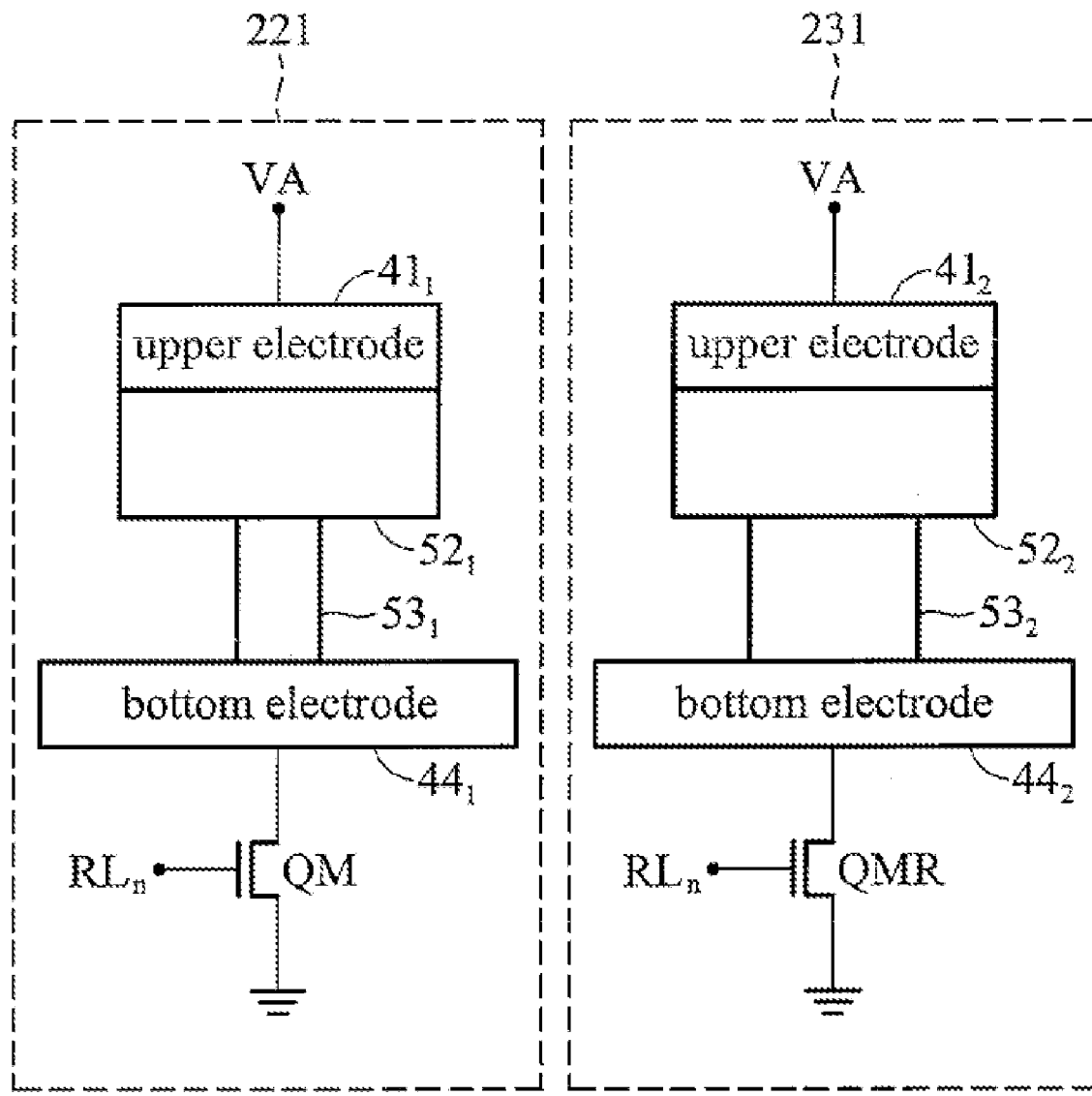
FIG. 5A is a schematic cross sections of another embodiment of the reference memory unit 231 and the primary memory unit 221.
Figure 5B:
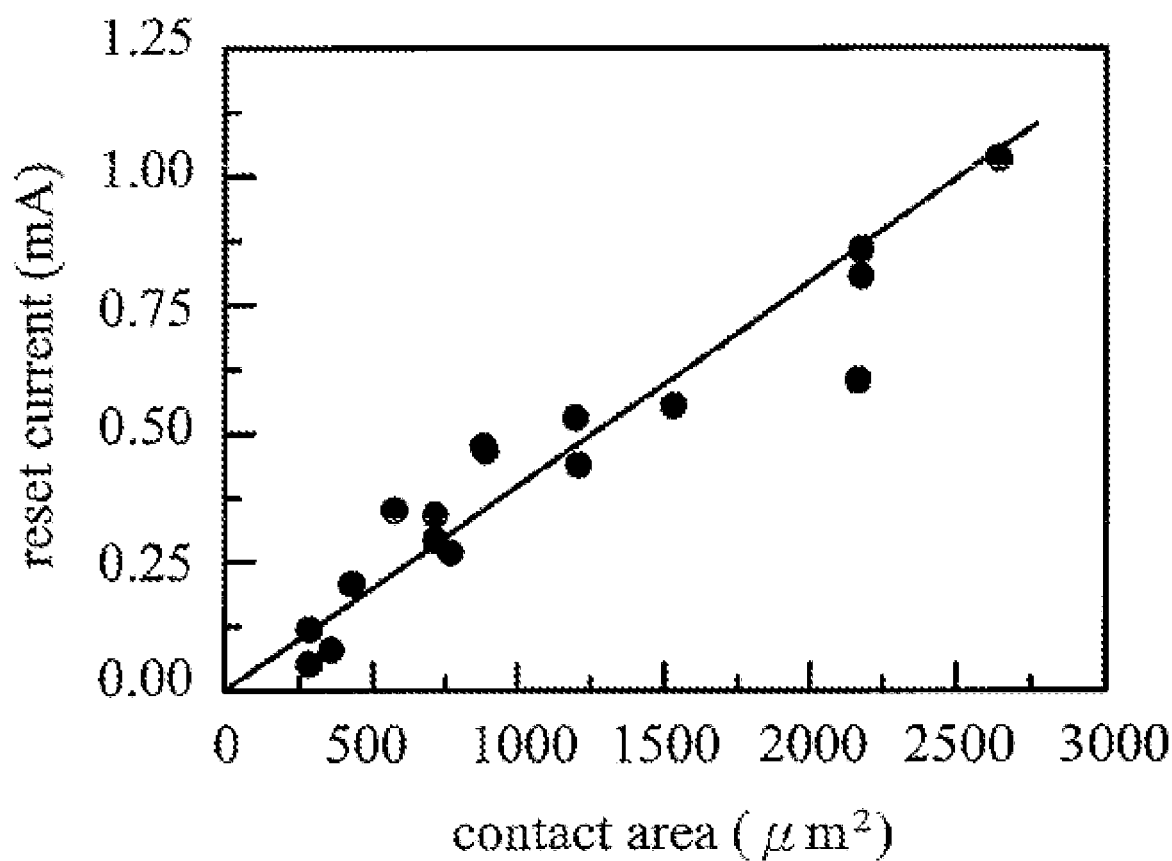
FIG. 5B is the relationship between the reset current and the contact area reported by Samsung Inc. in IEDM 2003.

FIG. 5A is a schematic cross section of another embodiment of the reference memory unit 231 and the primary memory unit 221. In this embodiment, the contact area between the heating electrode $53_1$ and the recording layer $52_1$ is different from the contact area between the heating electrode $53_2$ and the recording layer $52_2$. FIG. 5B is the relationship between the reset current and the contact area reported by Samsung Inc. in IEDM 2003. According to FIG. 5B, the reset current decreases with the reduction of the contact area between the heating electrode and the recording layer. Therefore, even when the same current is applied to the recording layers $52_1$ and $52_2$, the recording layers $52_1$ and $52_2$ may be programmed to different resistances. That is, the electrical characteristic curve of the recording layer of the primary memory unit 221 is thus different from the electrical characteristic curve of the recording layer of the reference memory unit 231.

Although the structure of the primary memory unit and reference memory unit has been described by way of the embodiment, it is to be understood that the invention is not limited thereto. In other embodiments, the primary memory unit and reference memory unit may have a plurality of recording layers.

This invention describes a reference memory unit that can adjust the reference signal by changing the structure of the reference memory unit, such as the recording layer size and the contact area between the heating electrode and the recording layer. As a result, the reference memory unit becomes more stable and reliable, and the sensing capability of the comparison circuit is also improved. Furthermore, the described reference memory unit can be implemented without additional processes.

While the invention has been described by way of example and in terms of embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase change memory, comprising:
   a primary memory array comprising at least one primary memory unit to generate at least one sensing signal, wherein each of the primary memory units comprises at least one recording layer which can be programmed to a first resistance and a second resistance;

a reference memory array comprising at least one reference memory unit to generate at least one reference signal, wherein each of the reference memory units comprises at least one recording layer which can be programmed to change its resistance; and a comparison circuit coupled to the primary memory array and the reference memory array, to compare the sensing signal and the reference signal to generate a comparison result, wherein the electrical characteristic curve of the recording layers of the primary memory units is different from the electrical characteristic curve of the recording layers of the reference memory units.

2. The memory as claimed in claim 1, wherein the sensing signal is a sensing voltage and the reference signal is a reference voltage.

3. The memory as claimed in claim 2, wherein the difference between the electrical characteristic curve of the recording layer of the primary memory unit and the electrical characteristic curve of the recording layer of the reference memory unit is utilized to make the voltage difference between the sensing voltage and the reference voltage larger than a predetermined voltage when the recording layer of the primary memory unit is programmed to the first resistance or the second resistance.

4. The memory as claimed in claim 1, wherein the difference between the electrical characteristic curve of the recording layer of the primary memory cell and the electrical characteristic curve of the recording layer of the reference memory cell is utilized to make the reference voltage to be equal to the average of a first voltage and a second voltage, wherein the first voltage or the second voltage are the sensing voltages when the recording layer of the primary memory cell is programmed to the first resistance or the second resistance.

5. The memory as claimed in claim 1, wherein at least one reference memory cell can be programmed to a third resistance which is different from the first resistance or the second resistance.

6. The memory as claimed in claim 1, wherein the reference memory array comprises a plurality of reference memory sets comprising a first reference memory unit which can be programmed to a third resistance and a second reference memory unit which can be programmed to a fourth resistance, wherein the larger one of the third resistance and the fourth resistance is different from the larger one of the first resistance and tire second resistance and/or the lower one of the third resistance and the fourth resistance is different from the lower one of the first resistance and the second resistance.

7. The memory as claimed in claim 6, wherein the first reference memory unit is connected in parallel to the second memory unit.

8. The memory as claimed in claim 1, wherein the dimension of at least one recording layer of the primary memory unit is different from the dimension of at least one recording layer of the reference memory unit.

9. The memory as claimed in claim 1, wherein the cross section area of at least one recording layer of the primary memory unit is different from the cross section area of at least one recording layer of the reference memory unit.

10. The memory as claimed in claim 1, wherein each primary memory unit further comprises a first heating electrode coupled to the recording layer of the primary memory unit, each reference memory unit further comprises a second heating electrode coupled to the recording layer of the reference memory unit, and the contact area between the first heating electrode and the recording layer of the primary memory unit is different from the contact area between the second heating electrode and the recording layer of the reference memory unit.

* * * * *